United States Patent [19]
Fujioka

[11] Patent Number: 5,180,684
[45] Date of Patent: Jan. 19, 1993

[54] SEMICONDUCTOR GROWTH PROCESS
[75] Inventor: Hiroshi Fujioka, Tokyo, Japan
[73] Assignee: Fujitsu Limited, Kanagawa, Japan
[21] Appl. No.: 488,837
[22] Filed: Mar. 6, 1990
[30] Foreign Application Priority Data
  Mar. 8, 1989 [JP] Japan .................. 1-055827
[51] Int. Cl.[5] .................. H01L 21/20; H01L 21/205
[52] U.S. Cl. .................. 437/110; 148/DIG. 25;
  148/DIG. 57; 148/DIG. 59; 148/DIG. 160;
  437/126; 437/137
[58] Field of Search .................. 148/25, 41, 59, 58,
  148/57, 72, 129, 160, 33, 33.1, 33.4, 33.5, DIG.
  18, DIG. 21; 156/610-614; 427/248.1, 255.1;
  437/81, 106, 108, 110, 112, 126, 132, 926, 949,
  976, 131

[56] References Cited
U.S. PATENT DOCUMENTS
| | | | |
|---|---|---|---|
| 4,378,259 | 3/1983 | Hosegawa et al. | 437/110 |
| 4,400,409 | 8/1983 | Izu et al. | 437/110 |
| 4,411,728 | 10/1983 | Sakamoto | 437/110 |
| 4,640,720 | 2/1987 | Foxon | 156/612 |
| 4,659,401 | 4/1987 | Reif et al. | 156/612 |
| 4,902,643 | 2/1990 | Shimawaki | 437/81 |
| 4,948,752 | 8/1990 | Geissberger et al. | 437/133 |
| 4,962,051 | 10/1990 | Liau | 437/110 |
| 4,963,508 | 10/1990 | Umeno et al. | 437/110 |

FOREIGN PATENT DOCUMENTS
085395A3 7/1983 European Pat. Off. .

OTHER PUBLICATIONS
King et al. "In-Situ Epitaxially groun Si p-n Junctions . . . ", IEEE Electron, Device Lett. vol. 9 No. 5, May 1988, pp. 229-231.
Gronet et al., "Growth of GeSi/Si Strained-layer Superlattices . . . ", J. Appl. Phys., vol. 61, No. 6 Mar. 15, 1987, pp. 2407-2409.
King et al., "Si/Si$_{1-x}$Ge$_x$ Heterojunction Bipolar Transistors . . . ", IEEE Electron Device Lett., vol. 10 No. 2, Feb. 1989, pp. 52-54.
Gibbons et al., "Limited Reaction Processing: Silicon and III-V Materials", Mat. Res. Soc. Symp. Proc., vol. 92; 1987, pp. 281-294.
Wolf et al., *Silicon Processing for the VLSI Era*, Lattice Press, Sunset Beach, California, 1986, pp. 142-143.
"Epitaxial Deposition Process", R. L. Bratter et al, IBM Technical Disclosure Bulletin, vol. 15, No. 2, p. 684, Jul. 1972.
"Silicon Epitaxy at 650°-800° Using Low-Pressure Chemical Vapor Deposition Both with and Without Plasma Enhancement", T. J. Donahue et al, 931 Journal of Applied Physics, 57(1985), Apr., No. 8, Part 1, pp. 2757-2765, Woodbury, New York, U.S.
"Limited Reaction Processing: Silicon Epitaxy", J. F. Gibbons et al, 320 Applied Physics Letter, 47(1985), Oct., No. 7, pp. 721-732, Woodbury, Woodbury, U.S.

*Primary Examiner*—Mary Wilczewski
*Attorney, Agent, or Firm*—Nikaido, Marmelstein, Murray & Oram

[57] ABSTRACT

A semiconductor growth process wherein a plurality of layers, each consisting of a different king of semiconductor material, are grown, includes the steps of: heating a substrate to a first growth starting temperature at which a growth of a first semiconductor layer can be started, supplying a first material gas to the surface of the substrate to cause a growth of the first semiconductor layer, lowering the temperature of the substrate to below first growth starting temperature, and at the same time, stopping the supply of the first material gas, to stop the growth of the first semiconductor layer, heating the substrate to a second growth starting temperature at which a growth of a second semiconductor layer can be started, and supplying a second material gas to the surface of the substrate to cause a growth of the semiconductor layer.

6 Claims, 6 Drawing Sheets

SEMICONDUCTOR GROWTH PROCESS

BACKGROUND OF THE INVENTION

1. Field of the Invention

The present invention relates to process and an apparatus for a semiconductor growth and more particularly, to a CVD process for producing a semiconductor epitaxial layer, and a CVD apparatus therefor.

2. Description of the Related Art

To form a thin epitaxial layer of a semiconductor material such as a silicon (Si), silicon germanium (SiGe) silicon carbide (SiC), etc., a CVD (Chemical Vapor Deposition) process, a MBE (Molecular Beam Epitaxial) process, a photo epitaxial growth process etc., are used.

Since an epitaxial growth by the CVD process is carried out at a comparatively high temperature of to 1200° C., for a long time, a greater diffusion than required is generated, and thus a satisfactorily shallow pn junction cannot be formed.

On the other hand, as an epitaxial growth process at a comparatively low temperature, e.g., 600 to 700° C., an MBE process and a photo epitaxial growth process are well known.

The MBE process, however, has problems in that the process is not suitable for mass production because of the necessity for a high vacuum condition, the poor crystallizability of a formed epitaxial layer, an epitaxial growth cannot be realized at a side wall of a semiconductor substrate, a selective growth cannot be carried out, and impurities cannot be doped into a semiconductor substrate to a high concentration, e.g., more than $10^{18}/cm^3$.

Further, the photo epitaxial growth process has problems in that a mass productivity thereby defective in that the window for introducing the UV light becomes fogged, and an epitaxial growth cannot be realized at a side wall of a semiconductor substrate.

In the above-mentioned problems, when impurities are not diffused at a required level when forming different layers, the interface therebetween is not clearly defined, i.e., a sharp distinction in layer boundaries cannot be observed. Thus, due to the non-distinctiveness of the boundaries therebetween, the amplification factor of the device becomes poor and the cut-off frequency $f_T$ is lowered with the result that the circuit transmitting speed is lowered.

SUMMARY OF THE INVENTION

An object of the present invention is to provide a semiconductor growth process whereby multilayers having a different composition of at least each neighboring layer are grown.

Another object of the present invention is to provide a semiconductor growth process wherein a satisfactorily shallow epitaxial pn junction can be produced.

A further object of the present invention is to provide a semiconductor growth apparatus whereby the above-mentioned process is carried out.

Accordingly there is provided a semiconductor growth process wherein a plurality of layers each consisting of a different kind of semiconductor material are grown, comprising the steps of: heating a substrate to a first growth starting temperature at which a growth of a first semiconductor layer can be started, supplying a first material gas to the surface of said substrate to cause a growth of the first semiconductor layer, lowering the temperature of the substrate to below said first growth starting temperature, and at the same time, stopping the supply of the first material gas, to stop the growth of the first semiconductor layer, heating the substrate to a second growth starting temperature at which a growth of a second semiconductor layer can be started, and supplying a second material gas to the surface of the substrate to cause a growth of the second semiconductor layer.

There is further provided semiconductor growth apparatus a comprising: a reaction vessel, wherein different kinds of lapped layers are grown on a substrate by introducing different kinds of gases for growth into a reaction vessel a heating unit for heating the substrate provided in the reaction vessel, a gas change-over unit for changing a plurality of gases for growth and a control unit for controlling the heating unit and the change-over unit so that at the same time as the temperature of the substrate reaches the growth temperature the gases for growth are introduced into the reaction vessel and at the same time as the gases for growth are changed, the heating of the substrate is stopped.

In the present invention an infrared heater such as tungsten halogen lamp or arc lamp, etc. can be used. In such, a heater temperature is increased by a rate of 40° C./sec and is lowered by a rate of 100° C./sec.

DESCRIPTION OF THE PREFERRED EMBODIMENTS

Figure 1:
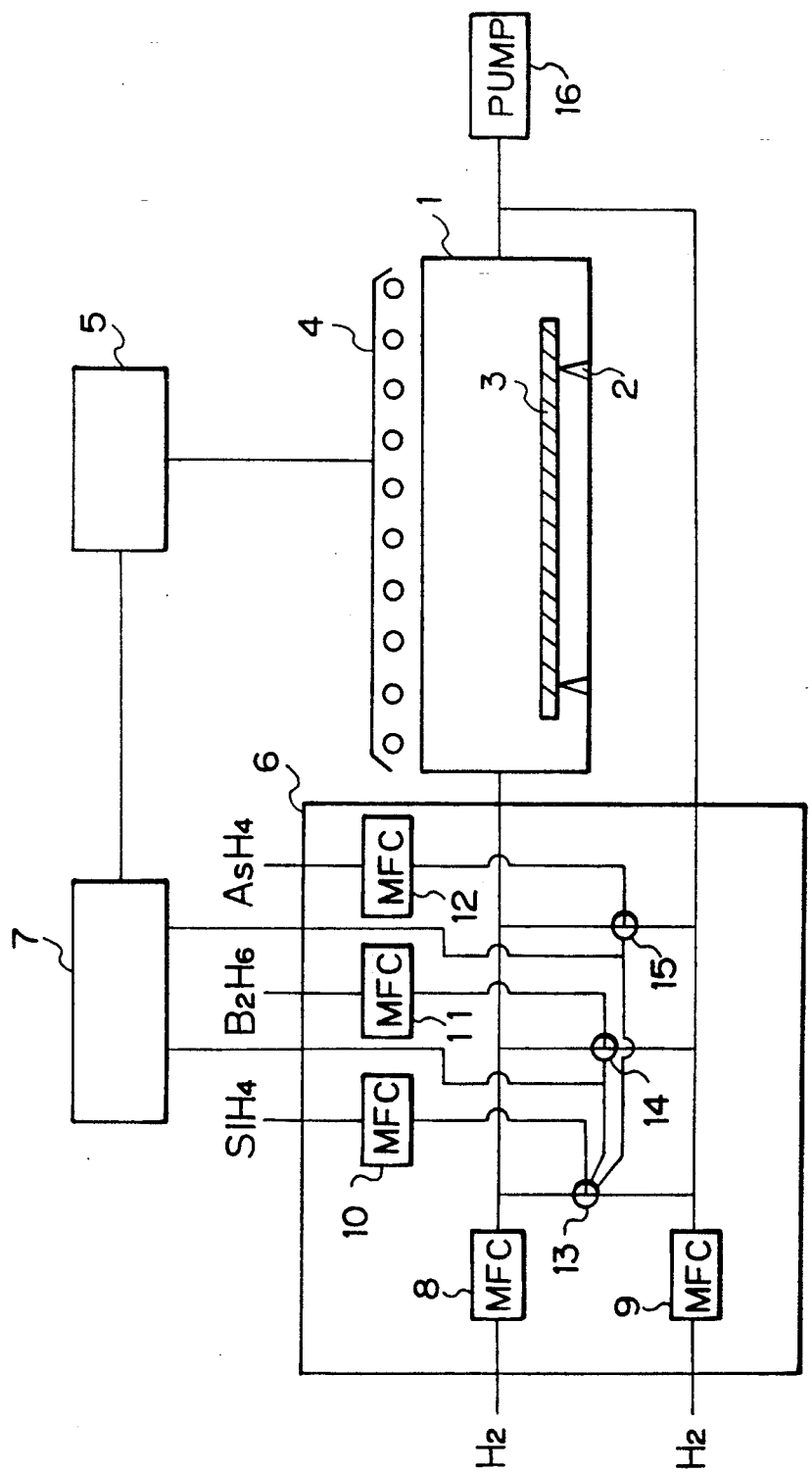
FIG. 1 is a schematic view of a CVD apparatus according to the present invention.

FIG. 1 shows a schematic view of a CVD apparatus according to the present invention.

As shown in FIG. 1, in a quartz tube reaction vessel 1, a wafer 3 of a silicon series semiconductor material such as Si, SiGe, SiC, etc. supported by pins 2 is provided, and an infrared heater 4 such as an arc lamp or a tungsten halogen lamp is provided above the reaction vessel, to heat the wafer 3. The infrared heater 4 is connected to an electric source 5 which an electric power is supplied thereto.

The electric source 5 is connected to a gas supply and a heating controller 7, and the controller 7 is connected to a high speed gas change-over unit 6 consisting of carrier gas ($H_2$) mass flow controllers (MFC) 8 and 9, reacting gas MFC's 10 to 12, and three-way valves 13 to 15.

In the high speed gas change-over unit, at least two different kinds of gas compositions are introduced into the reaction vessel 1 so that at least two different epitaxial layers are grown on the wafer.

Using the apparatus shown in FIG. 1 a method of producing a bipolar transistor on a $p^-$ type silicon substrate 17 with an $n^+$ well 18 therein will now be explained.

Figure 2:
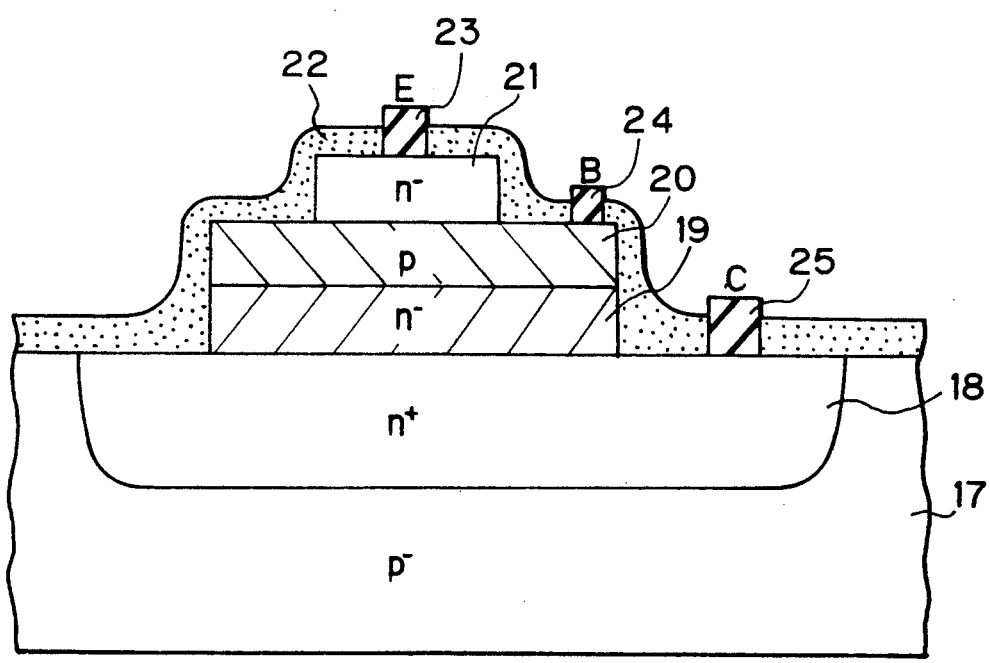
FIG. 2 is a cross-sectional view of a bipolar transistor according to the present invention.

The structure of the bipolar transistor is shown in FIG. 2.

H$_2$ gas is supplied to the reaction vessel 1 as a carrier gas, at a flow rate of 1 e/min atmosphere in the reaction vessel 1 is heated to a temperature of 900° C. under a pressure of 5 Torr, to clean the p$^-$ substrate, for five minutes.

Then the atmosphere in the reaction vessel 1 is preferably cooled to a temperature of 500° C. In this case 550° C. may be used.

Figure 3:
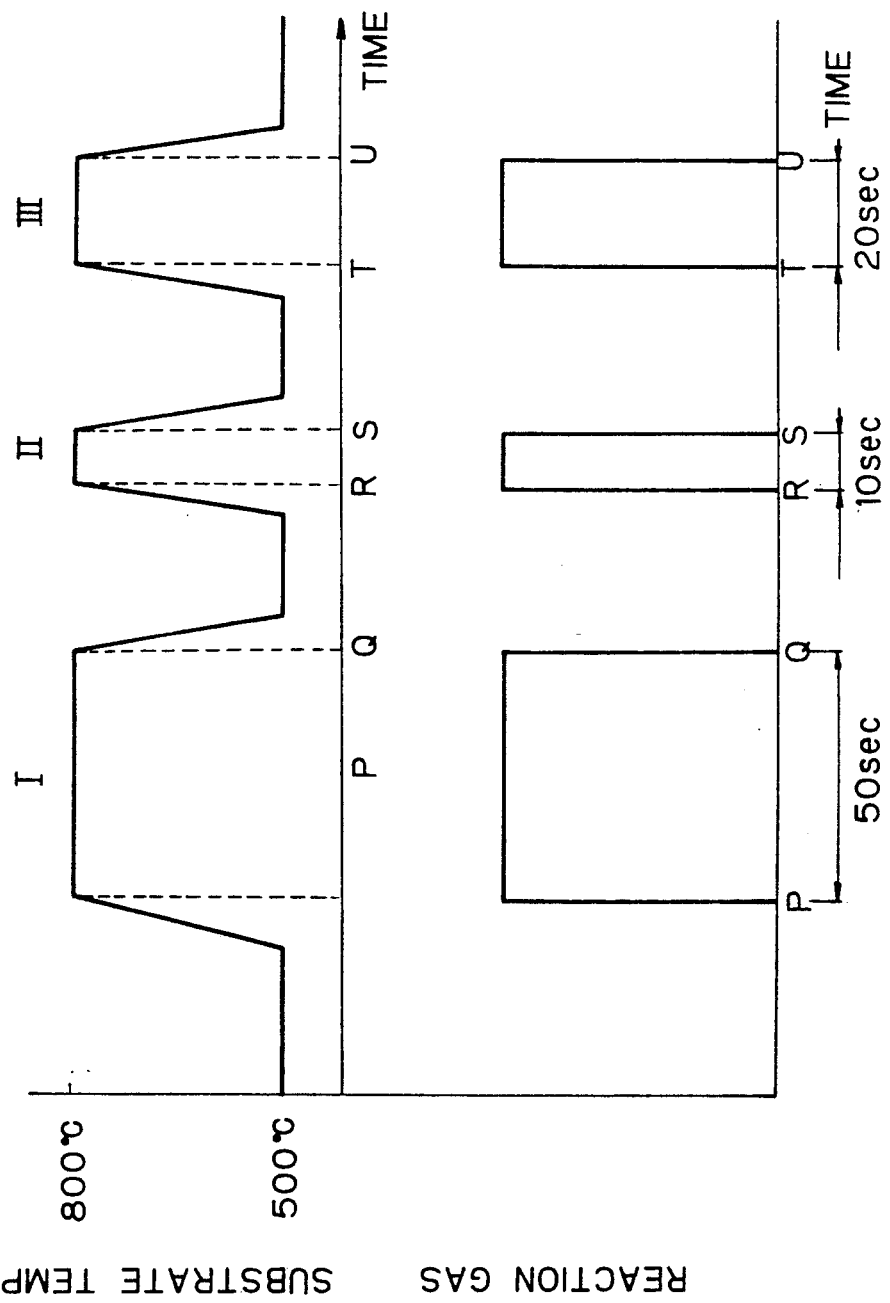
FIG. 3 is a sequence of an epitaxial growth according to the present invention.

The epitaxial growth sequence is shown in FIG. 3, wherein the regions I, II and III corresponds to growth regions of an n$^-$ layer 19, a p-layer 20 and an n$^-$ layer 21 shown in FIG. 2, respectively, and the temperature of the atmosphere in the reaction vessel 1 is maintained at 500° C. the controller increases the power supplied by the electronic source 5 just before a point P, to increase the temperature of the wafer 3 heated by the infrared heater 4. The controller 7 controls temperature of the wafer to 800° C. at the point P (FIG. 3).

On the other hand, at the same time as the temperature of the wafer reaches 800° C. the controller 7 controls the high speed gas change-over unit 6 so that a mixture of SiH$_4$ and AsH$_3$ (mixed ratio SiH$_4$:B$_2$H$_6$=1000:3) is introduced into the reaction vessel 1 through the MFCs 10 and 12 and the three-way valves 13 and 15 for 50 sec. In this example, SiH$_4$ gas is introduced into the reaction vessel 1 at a flow rate of 100 cc/min.

When 50 sec. has passed (point Q) and the gas flow is stopped by the controller 7, the controller 7 simultaneously switches off the electric source 5 so that the temperature of the atmosphere in the reaction vessel 1 is lowered to a temperature of 500° C.

The process causes a growth of an n$^-$ epitaxial layer 19 having a thickness of 5000 Å on the substrate.

Then, the controller 7 again increases the power from the electric source 5 just before a point R (FIG. 3) to increase the temperature of the wafer 3 heated by the infrared heater 4. The controller 7 controls the temperature of the wafer to 800° C. at the point R.

On the other hand, as explained above, at the same time as the temperature of the wafer becomes 800° C., the controller 7 controls the high speed gas change-over unit 6 so that a mixture of SiH$_4$ and B$_2$H$_6$ (mixed ratio SiH$_4$:B$_2$H$_6$=1000:3) is introduced into the reaction vessel through the MFCs 10 and 11 and three-way valves 13 and 14, for 10 sec. This process sequence corresponds to the region II (R to 5). Note, in this process, the H$_2$ carrier gas flows together with the ion gas at a flow rate of 1 e/min. and SiH$_4$ gas flows into the reaction vessel 1 at a flow rate of 100 cc/min.

When the 10 sec has passed (point S) and the gas flow is stopped by the controller 7, the controller 7 simultaneously switches off the electric source 5 so that the temperature of the atmosphere in the reaction vessel 1 is lowered to a temperature of 500° C.

This second process causes the growth of the p type epitaxial layer 21 having a thickness of 1000 Å on the n$^-$ type epitaxial layer 19.

In the same manner as above, the n$^-$ type epitaxial layer 21 having a thickness of 2000 Å is grown on the p type epitaxial layer 20, using SiH$_4$, AsH$_3$ and H$_2$ gases. The growth time from T to U is 20 sec.

Figure 4:
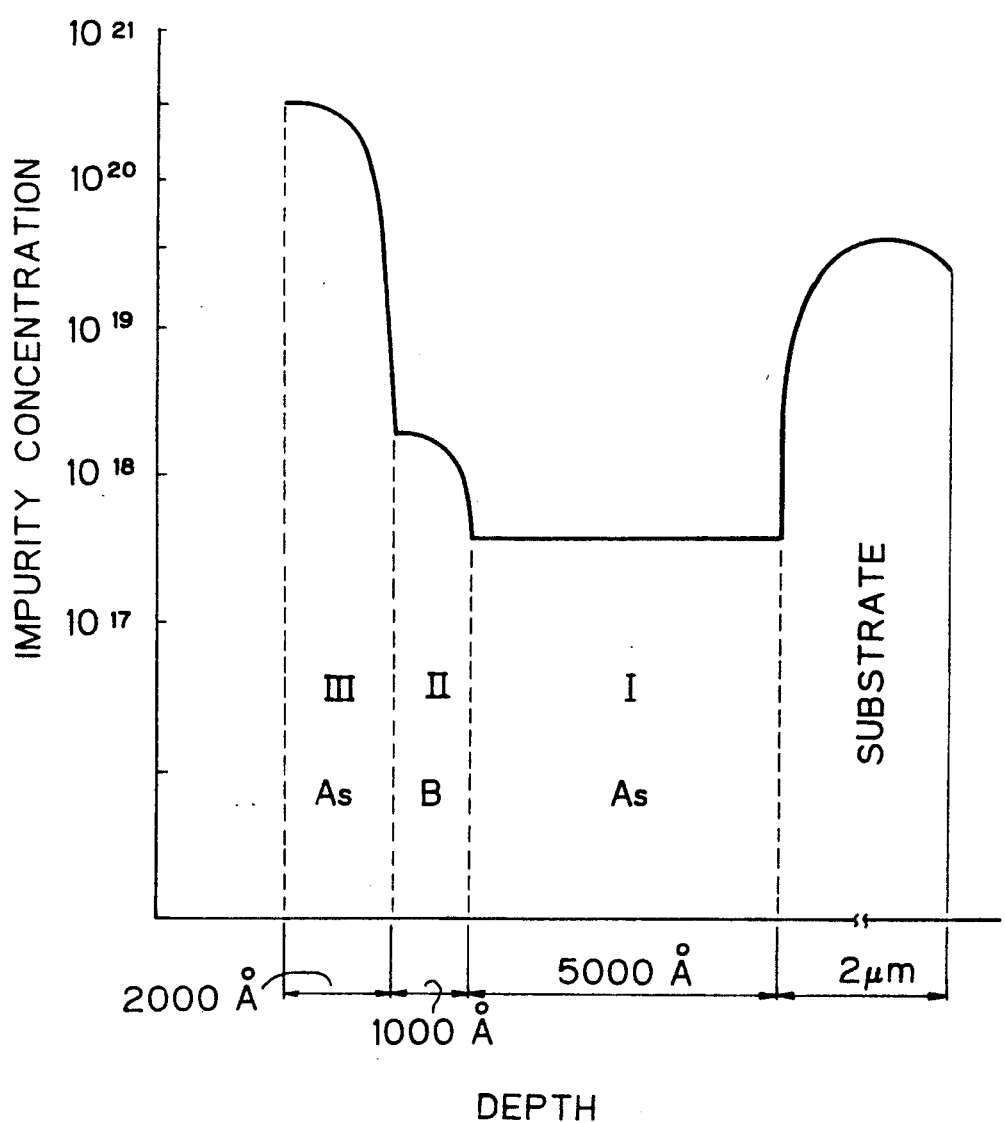
FIG. 4 shows the relationship between an impurity concentration and a depth from a substrate.

The thus-obtained n$^-$pn$^-$ type epitaxial layers 19, 20 and 21 have respective impurity concentrations of $5 \times 10^{17}$, $3 \times 10^{18}$ and $5 \times 10^{20}$, as shown in FIG. 4. FIG. 4 is an impurity profile obtained by a SIMS, and in FIG. 4 the regions I, II, and III correspond to the regions I, II, and III of FIG. 3. The region I corresponding to the n$^-$ type epitaxial layer 19 has a thickness of 5000 Å, the region II corresponding to the p type epitaxial layer 20 has a thickness of 1000 Å, and the region III corresponding to the n$^-$ type epitaxial layer has a thickness of 2000 Å. The right side of the region I is an n$^+$ type well in the substrate.

As shown in FIG. 4, a very clear epitaxial pn junction can be formed.

After forming the n$^-$pn$^-$ type epitaxial layers 19, 20 and 21, mesa etching is carried out twice, and a passivation film of SiO$_2$ is then formed on the n$^-$ type epitaxial layer 19, p type epitaxial layer 20, and the substrate 17, to a thickness of 2000 Å, by a well known CVD process. When contact windows for the emitter base and collector are opened, and thereafter, Al-Si is sputtered to a thickness of 1 μm and selectively etched to form an emitter (E) electrode 23, a base (B) electrode 24, and a collector (C) electrode 25, whereby a bipolar transistor having the structure shown in FIG. 2 is produced.

Figure 5:
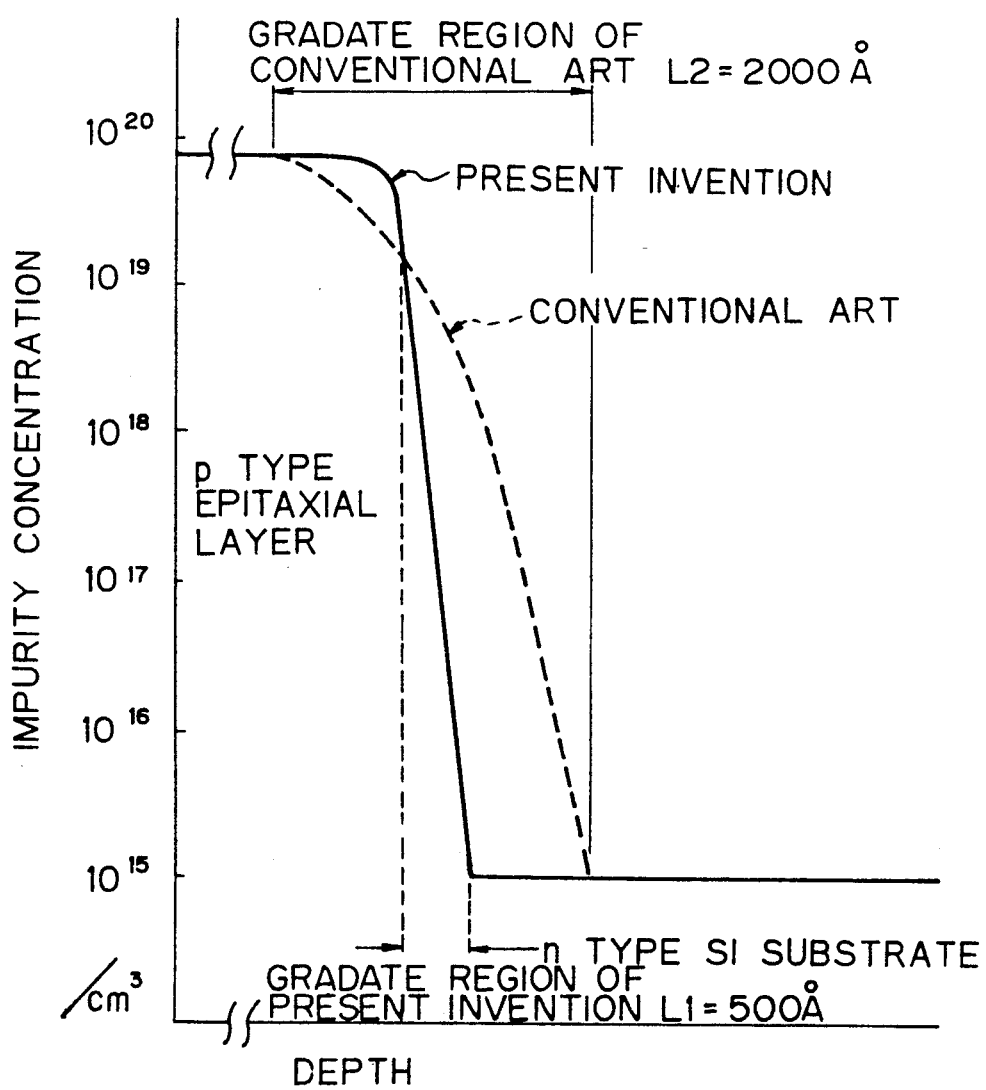
FIG. 5 is a view explaining the effects of the present invention compared with those of the prior art.

FIG. 5 is an example showing a sharpness of a pn boundary in the present invention. As can be seen from FIG. 5, the present invention has a shorter impurity deviation distance (L$_1$) in the depth direction than that (L$_2$) of a prior art.

Figure 6:
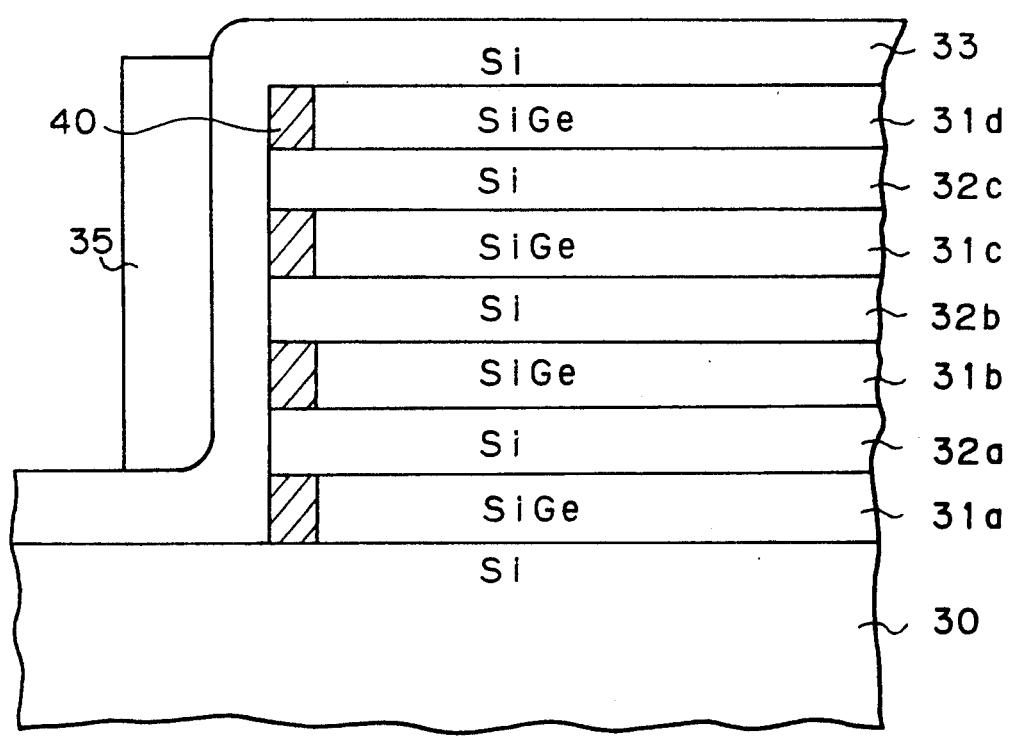
FIG. 6 is a cross-sectional view of another example according to the present invention.

FIG. 6 shows a schematic cross-sectional view of a semiconductor element formed by using a quantum wire according to the present invention.

As shown in FIG. 6, a non-doped SiGe layer 31a, a non-doped Si layer 32a, a non-doped SiGe layer 31b, a non-doped Si layer 32b, a non-doped SiGe layer 31c, a non-doped Si layer 32c, and a non-doped SiGe layer 31d are formed on a silicon substrate 30. Quantum wire 40 are formed on the side of SiGe layers 31a, 31b, 31c and 31d. A gate electrode 35 is provided for the FET. Note, 33 is a p$^+$ type epitaxial layer having a thickness of 500 Å according to the present invention.

In the quantum wire of this structure as shown in FIG. 6, carriers are not scattered and the mobility of carriers is very high, and thus if an FET is produced by using the quantum wire a superior high speed element can be realized.

I claim:

1. A semiconductor growth process wherein a plurality of layers each consisting of a different kind of semiconductor material are grown, comprising the steps of:

heating a substrate to a first growth starting temperature at which a growth of a first semiconductor layer can be started;

supplying a first material gas to a surface of said substrate to cause a growth of said first semiconductor layer after said substrate is heated to said first growth starting temperature;

cooling said substrate to a temperature below said first growth starting temperature and below a following second growth starting temperature, and at the same time, stopping the supply of said first material gas, to stop the growth of said first semiconductor layer;

reheating said substrate to said second growth starting temperature, at which a growth of a second semiconductor layer can be started; and supplying a second material gas to the surface of said substrate to cause a growth of said second semiconductor layer after said substrate is reheated to said second growth starting temperature.

2. A process according to claim 1, wherein said substrate is heated by an infrared heater.

3. A process according to claim 2, wherein said infrared heater is one of a halogen lamp and arc lamp.

4. A process according to claim 1, wherein said first semiconductor layer and said second semiconductor layer are respectively composed of a different conductive type silicon.

5. A process according to claim 4, wherein a dopant gas therefor $AsH_3$ and $B_2H_6$ are respectively used at the same time as the growth gas for said first and second semiconductor layer, $SiH_4$ is used.

6. A process according to claim 1, wherein said first semiconductor layer is SiGe and said second semiconductor layer is Si.

* * * * *